(12) United States Patent
Suzuki et al.

(10) Patent No.: US 6,172,938 B1
(45) Date of Patent: Jan. 9, 2001

(54) ELECTRONIC INSTRUMENT AND SEMICONDUCTOR MEMORY DEVICE

(75) Inventors: Takaaki Suzuki; Masao Taguchi; Kotoku Sato, all of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/338,597

(22) Filed: Jun. 23, 1999

(30) Foreign Application Priority Data

Jun. 25, 1998 (JP) .................................................. 10-178315

(51) Int. Cl.$^7$ ...................................................... G11C 8/00
(52) U.S. Cl. ............................................................. 365/233
(58) Field of Search ................................. 365/194, 233

(56) References Cited

U.S. PATENT DOCUMENTS

| | | | |
|---|---|---|---|
| 5,440,511 | * 8/1995 | Yamamoto et al. | 365/233 |
| 5,708,623 | * 1/1998 | Choi | 365/233 |
| 5,844,857 | * 12/1998 | Son et al. | 365/194 |
| 5,856,952 | * 1/1999 | Yoo et al. | 365/233 |
| 6,016,066 | * 1/2000 | Ilkbahar | 327/23 |

* cited by examiner

Primary Examiner—Trong Phan
(74) Attorney, Agent, or Firm—Arent Fox Kintner Plotkin & Kahn, PLLC

(57) ABSTRACT

An electronic instrument includes a memory device, clock lines through which complementary clock signals are transmitted to be used for synchronization of a data output operation and a data input operation for the memory device, and strobe signal lines through which a first output strobe signal, a second output strobe signal, a first input strobe signal and a second input strobe signal are transmitted to be used to settle output data from the memory device in the data output operation and to settle input data supplied to the memory device, the first and second output strobe signals being in complementary relation to each other, the first and second input strobe signals being in complementary relation to each other.

23 Claims, 14 Drawing Sheets

ELECTRONIC INSTRUMENT AND SEMICONDUCTOR MEMORY DEVICE

BACKGROUND OF THE INVENTION

1. Field of the Invention

The present invention relates to an electronic instrument having a semiconductor memory device for which read and write operations are executed in synchronism with strobe signals, and the semiconductor memory device.

2. Description of the Related Art

A circuit configuration of a part of a conventional electronic instrument is shown in FIG. 1. Referring to FIG. 1, there is a DDR-SDRAM (Double Data Rate Synchronous Dynamic Random Access Memory) 1 which operates in synchronism with rising and falling edges of a clock signal. The actual electronic instrument has a plurality of DDR-SDRAMs and a control chip controlling the plurality of DDR-SDRAMs.

The electronic instrument further has a positive-phase clock line 2, an inverse-phase clock line 3, a command bus 4, an address bus 5 and a data bus 6. A positive-phase clock signal CLK is transmitted through the positive-phase clock line 2. An inverse-phase clock signal /CLK having a phase which is in inverse relation to the phase of the positive-phase clock signal CLK is transmitted through the inverse-phase clock line 3. Command signals are transmitted through the command bus 4. Row address signals and column address signals are transmitted through the address bus 5. Data is transmitted through the data bus 6.

In addition, a strobe signal line 7 is provided in the electronic instrument. An output strobe signal QSOUT is transmitted to the control chip through the strobe signal line 7 in a data read operation (a data output operation) for each of the plurality of DDR-SDRAMS (e.g., the DDR-SDRAM 1). The output strobe signal QSOUT is supplied to the control chip together with output data DQOUT and used to appoint a take-in timing of the output data DQOUT. An input strobe signal QSIN is transmitted to the DDR-SDRAM 1 through the strobe signal line 7 in a data write operation (a data input operation) for the DDR-SDRAM 1. The input strobe signal QSIN is supplied to the DDR-SDRAM 1 together with input data DQIN and used to appoint a take-in timing of the input data DQIN.

An essential part of the DDR-SDRAM 1 is shown in FIG. 2. Referring to FIG. 2, the DDR-SDRAM 1 has a command buffer 9, a command decoder 10 and a controller 11. The command buffer 9 receives a command signal transmitted through the command bus 4. The command decoder 10 decodes the command signal output from the command buffer 9. The controller 11 receives a decoded command signal from the command decoder 10 and controls an internal circuit of the DDR-SDRAM 1 in accordance with the contents of the decoded command signal.

The DDR-SDRAM 1 further has an address buffer 12, a plurality of memory banks 14-1–14-m and address latches 13-1–13-m. The address buffer 12 receives a row address signal and a column address signal transmitted through the address bus 5. Each of the address latches 13-1–13-m latches the row address signal and column address signal output from the address buffer 12. The memory bank 14-1 has a memory array 15-1 in which memory cells are arranged, a row decoder 16-1, a sense-amp unit 17-1 and a column decoder 18-1. The row decoder 16-1 decodes the row address signal latched by the address latch 13-1 to select a ward line. The sense-amp unit 17-1 includes sense amplifiers amplify data read out from a memory cell specified by the selected word line. The column decoder 18-1 decodes the column address signal latched by the address latch 13-1 to select a column. The other memory banks (14-m) have the same structure as the memory bank 14-1.

The DDR-SDRAM 1 has data bus buffers 19-1–19-m and write buffers 20-1–20-m. Each of the data bus buffers 19-1–19-m amplifies read data output from a corresponding one of the memory banks 14-1–14-m to a corresponding one of core data buses CDB1–CDBm. Each of the write buffers 20-1–20-m outputs write data to a corresponding one of the core data buses CDB1–CDBm.

The DDR-SDRAM 1 further has a data output buffer 21, a data input buffer 22, a strobe output buffer 23 and a strobe input buffer 24. A peripheral data bus DB connects the data bus buffers 19-1–19-m and the write buffers 20-1–20-m to the data output buffer 21 and the data input buffer 22. The data output buffer 21 outputs the output data DQOUT to the outside and the data input buffer 22 receives from the outside input data DQIN having N bits arranged in parallel. The strobe output buffer 23 outputs the output strobe signal QSOUT. The strobe input buffer 24 receives the input strobe signal QSIN and is used to control a take-in timing of the input data DQIN.

Relationships among the complementary clock signals CLK and /CLK, the output strobe signal QSOUT and the output data DQOUT in the data output operation (the data read operation) for the DDR-SDRAM 1 are shown in FIG. 3. Referring to FIG. 3, a time tCKQS is a QS access time from an edge of the clock signal CLK, and a time tQSPRE is a QS preamble time, a time tQSPOT is a QS postamble time. Further, a time tQSQ is a data output skew from an edge of the output strobe signal QSOUT, a time tAC is a data access time from an edge of the output strobe signal QSOUT, and a time tDV is a data output valid time.

Relationships among the complementary clock signals CLK and /CLK, the input strobe signal QSIN and the input data DQIN in a data input operation (the data write operation) for the DDR-SDRAM 1 are shown in FIG. 4. Referring to FIG. 4, a time tDS is a data input set up time, and a time tDH is a data input hold time from each edge of the input strobe signal QSIN.

In the electronic instrument having the above structure, the output strobe signal QSOUT is transmitted from the DDR-SDRAM 1 through the strobe signal line 7 together with the output data DQOUT through the data bus 6 so that the settling period for the output data DQOUT on the basis of the output strobe signal QSOUT is constant. As a result, it is easy for the control chip to receive the output data DQOUT. The input strobe signal QSIN is transmitted from the control chip through the strobe signal line 7 together with the input data DQIN through the data bus 6 so that the settling period the input data DQIN on the basis of the input strobe signal QSIN is constant. As a result, it is easy for the DDR-SDRAM 1 to receive the input data DQIN.

However, if the rising time and falling time of each of the strobe signals QSOUT and QSIN are varied, the strobe period is not constant. The settling period for the data DQOUT and DQIN is thus not constant. As a result, it is difficult to adjust the take-in timing of the data DQOUT and DQIN. If the strobe period is shortened to access the DDR-SDRAM 1 at a very high speed, for example, if the strobe period is equal to or less than 4 nanoseconds (ns), the data DQOUT and DQIN may not be certainly settled.

SUMMARY OF THE INVENTION

Accordingly, a general object of the present invention is to provide a novel and useful electronic instrument and semiconductor memory device in which the disadvantages of the aforementioned prior art are eliminated.

A specific object of the present invention is to provide an electronic instrument in which even if the strobe period used to appoint the take-in timing of the data is shortened to access the semiconductor memory device at a very high speed, the data can be certainly settled.

The above objects of the present invention are achieved by an electronic instrument comprising: a memory device; clock lines through which complementary clock signals are transmitted to be used for synchronization of a data output operation for the memory device; and strobe signal lines through which a first output strobe signal and a second output strobe signal are transmitted to be used to settle output data from the memory device in the data output operation, the first and second output strobe signals being in complementary relation to each other.

According to the present invention, even if the rising time and falling time of each of the first and second output strobe signals which are in complementary relation to each other are varied, the strobe period of the first and second output strobe signals (the period between cross points of the first and second output strobe signal) are constant. As a result, the period in which the output data is settled can be constant. Thus, even if the strobe period used to appoint the take-in timing of the output data is shortened to access the memory device at a very high speed, the output data can be certainly settled.

The above objects of the present invention are also achieved by an electronic instrument comprising: a memory device; clock lines through which complementary clock signals are transmitted to be used for synchronization of a data input operation for the memory device; and strobe signal lines through which a first input strobe signal and a second input strobe signal are transmitted to be used to settle input data supplied to the memory device in the data input operation, the first and second input strobe signals being in complementary relation to each other.

According to the present invention, even if the rising time and falling time of each of the first and second input strobe signals which are in complementary relation to each other are varied, the strobe period of the first and second input strobe signals (the period between cross points of the first and second input strobe signal) are constant. As a result, the period in which the input data is settled can be constant. Thus, even if the strobe period used to appoint the take-in timing of the input data is shortened to access the memory device at a very high speed, the input data can be certainly settled.

The above objects of the present invention are achieved by a semiconductor device provided in an electronic instrument having clock lines through which complementary clock signals are transmitted to be used for synchronization of a data output operation for the semiconductor memory device, and strobe signal lines through which a first output strobe signal and a second output strobe signal are transmitted to be used to settle output data from the semiconductor memory device in the data output operation, the first and second output strobe signals being in complementary relation to each other, the semiconductor memory device comprising: a data output buffer that outputs the output data from a memory bank; and a strobe output buffer that generates the first and second output strobe signals based on a predetermined signal, the first and second output strobe signals being supplied from the strobe output buffer to the strobe signal lines when the output data is output from the data output buffer.

Further, the above objects of the present invention are achieved by a semiconductor memory device provided in an electronic instrument having clock lines through which complementary clock signals are transmitted to be used for synchronization of a data input operation for the semiconductor memory device, and strobe signal lines through which a first input strobe signal and a second input strobe signal are transmitted to be used to settle input data supplied to the semiconductor memory device in the data input operation, the first and second input strobe signals being in complementary relation to each other, the semiconductor memory device comprising: a strobe input buffer that receives the first and second input strobe signals transmitted through the strobe signal lines and generates a strobe clock signal based on the first and second input strobe signals; and a data input buffer that receives input data items supplied to the semiconductor memory device, the input data items being settled by using the clock strobe signal generated by the input strobe buffer.

BRIEF DESCRIPTION OF THE DRAWINGS

Other objects, features and advantages of the present invention will be apparent from the following description when read in conjunction with the accompanying drawings, in which.

DESCRIPTION OF THE PREFERRED EMBODIMENTS

A description will be given, with reference to the drawings, of an embodiment of the present invention.

Figure 1:
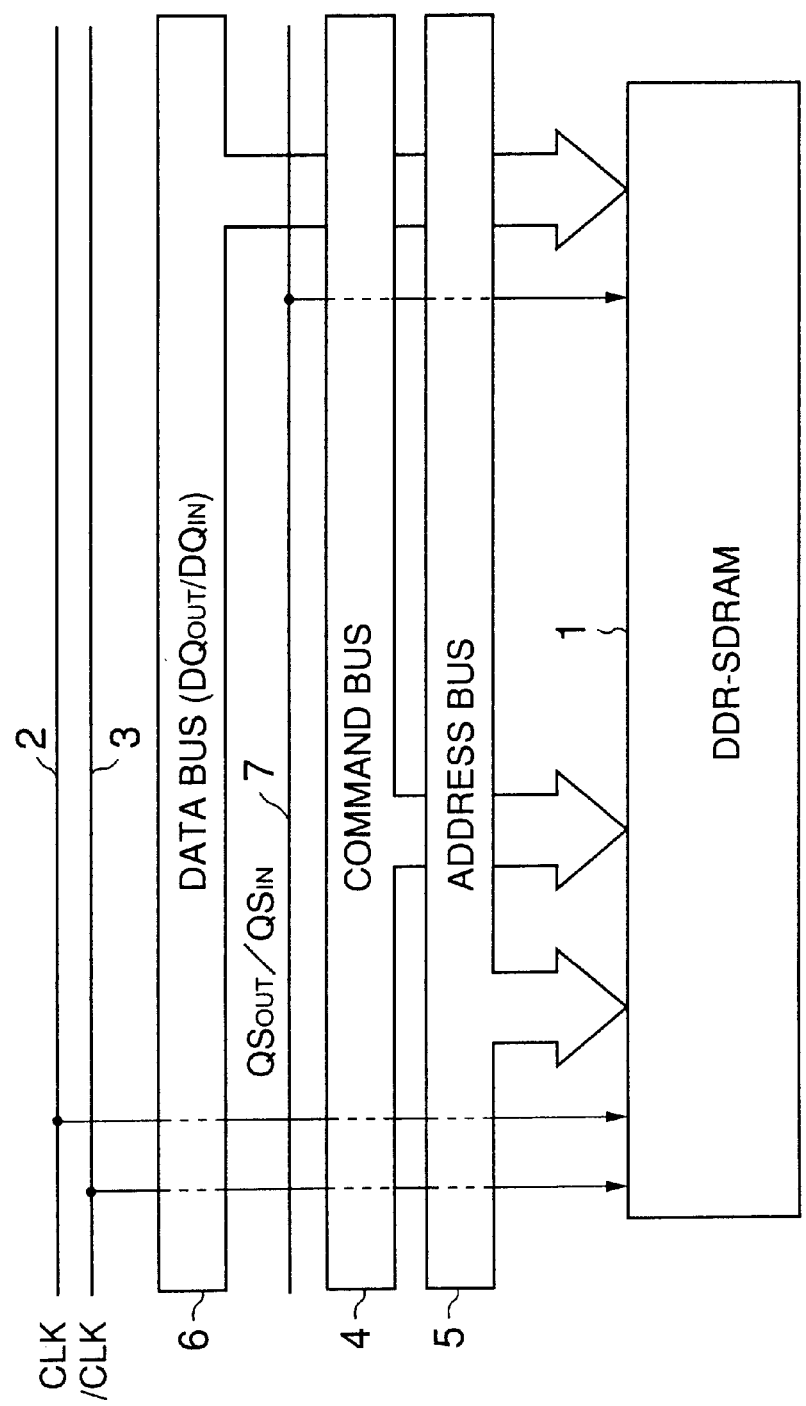
FIG. 1 is a circuit diagram illustrating a part of a conventional electronic instrument.
Figure 2:
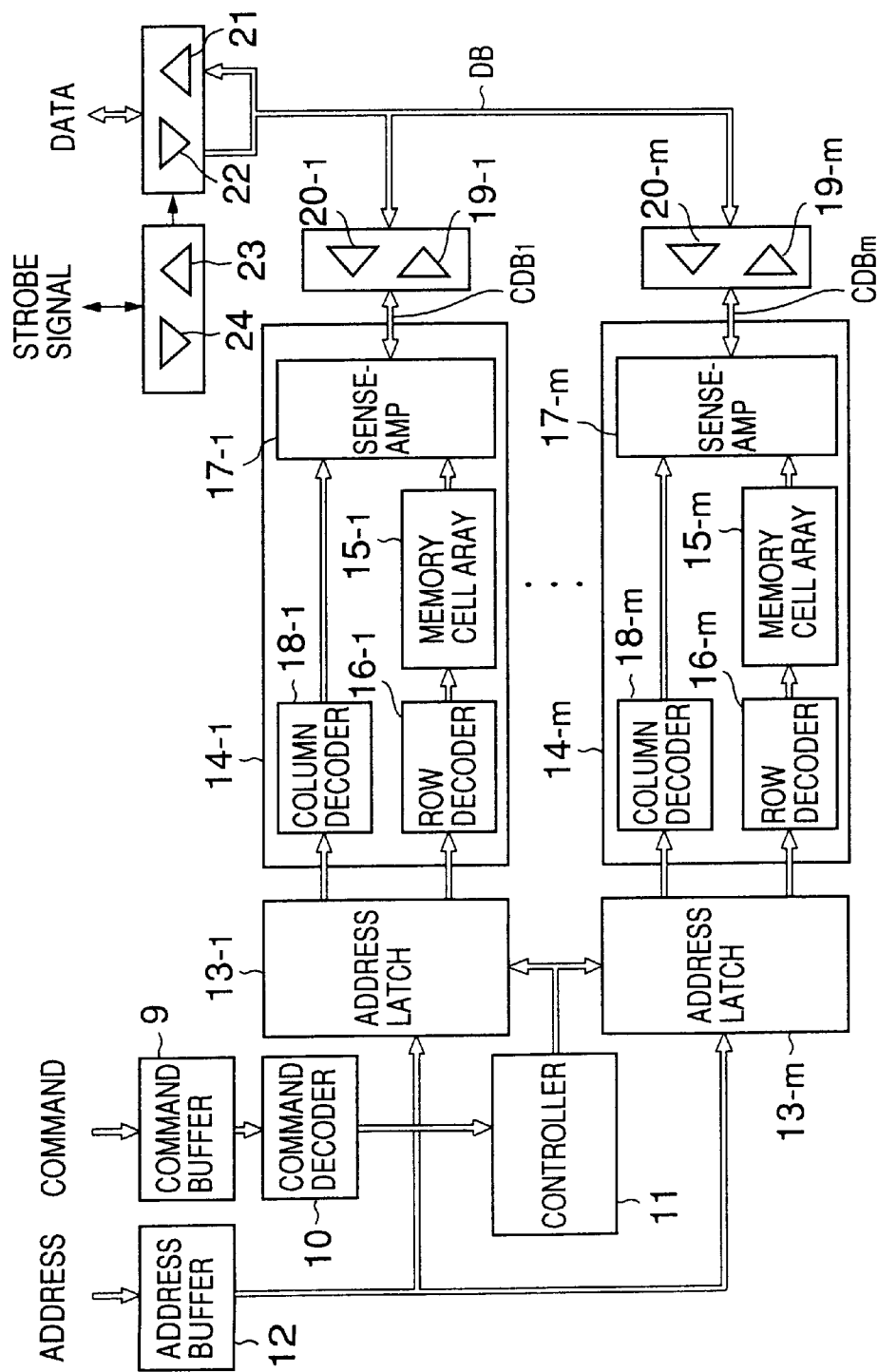
FIG. 2 is a circuit diagram illustrating a DDR-SDRAM provided in the electronic instrument.
Figure 3:
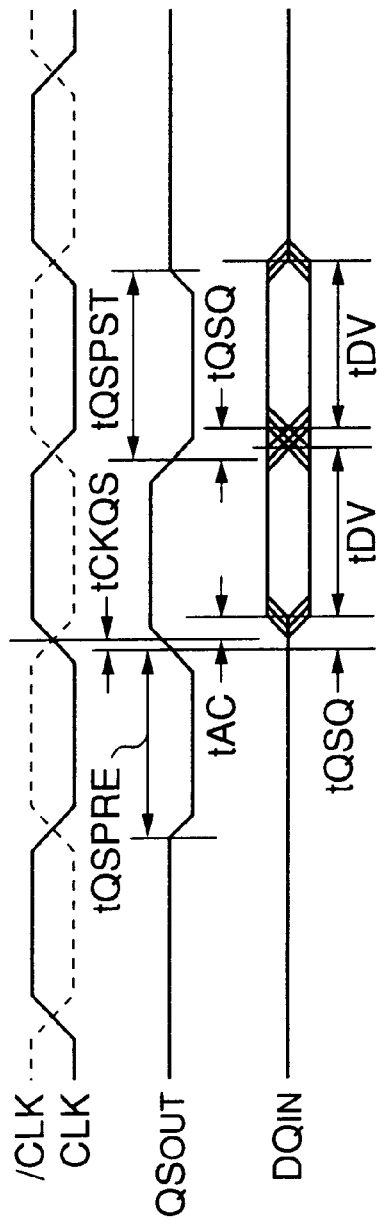
FIG. 3 is a timing chart illustrating signals and output data in a data output operation.
Figure 4:
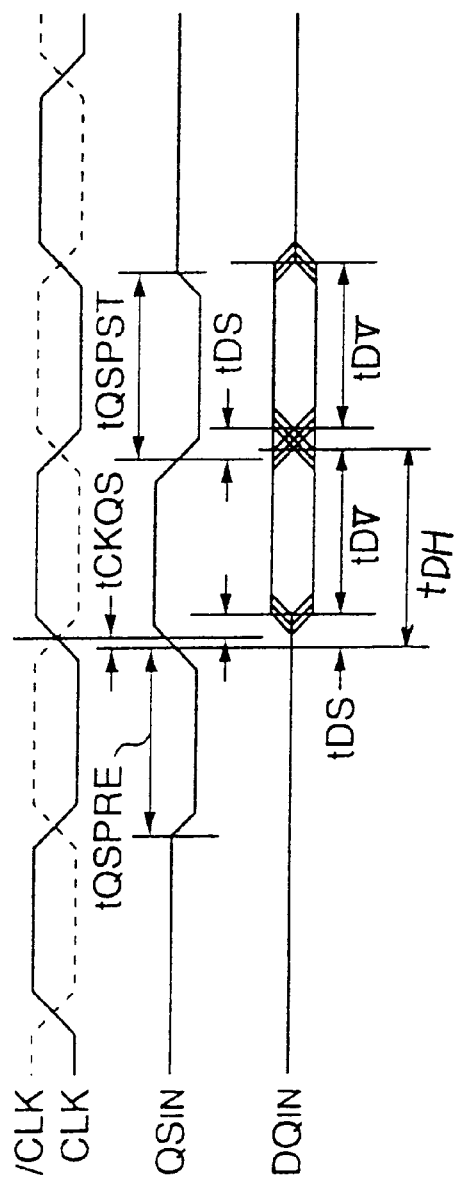
FIG. 4 is a timing chart illustrating signals and input data in a data input operation.
Figure 5:
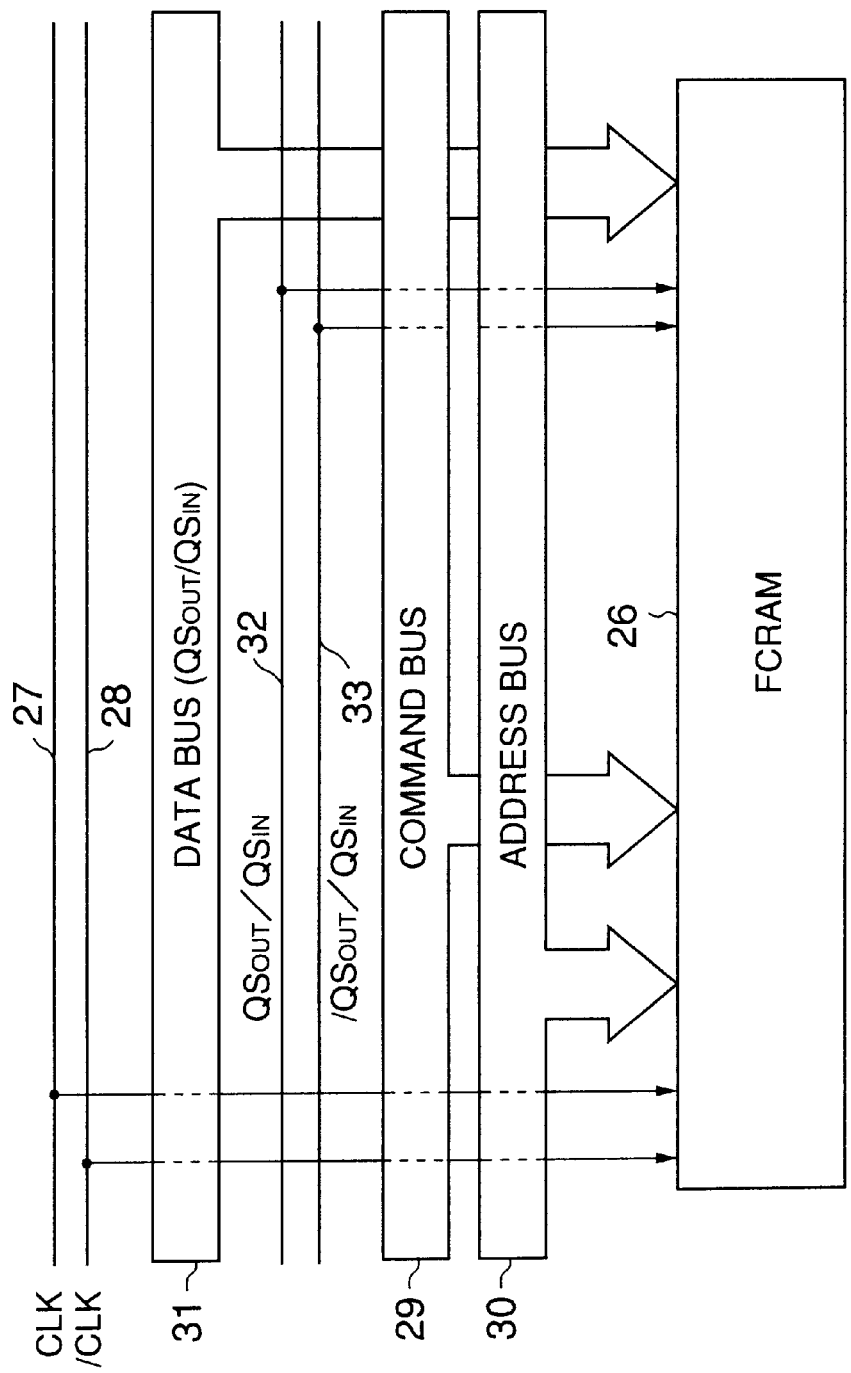
FIG. 5 is a circuit diagram illustrating a part of an electronic instrument according to an embodiment of the present invention.

A part of an electronic instrument according to an embodiment of the present invention is formed as shown in FIG. 5. Referring to FIG. 5, there is an FCRAM (First Cycle Random Access Memory) 26 which is one type of the DDR-SDRAM. The FCRAM 26 is an embodiment of the semiconductor memory device according to the present invention. The actual electronic instrument has a plurality of FCRAMS having the same structure and a control chip controlling the plurality of FCRAMS.

The electronic instrument has a positive-phase line 27, an inverse-phase line 28, a command bus 29, a address bus 30 and a data bus 31. A positive-phase clock signal CLK is transmitted through the positive-phase line 27. An inverse-phase clock signal /CLK having a phase which is in inverse relation to the phase of the positive-phase clock signal CLK is transmitted through the inverse-phase line 28. Command signals are transmitted through the command bus 29. Row address signals and column address signals are transmitted through the address bus 30. Data is transmitted through the data bus 31.

The electronic instrument further has a positive-phase strobe line 32 and an inverse-phase strobe line 33. A positive-phase output strobe signal QSOUT which is output from each of the FCRAMs (e.g., the FCRAM 26) together with output data DQOUT is transmitted to the control chip through the positive-phase strobe line 32. The positive-phase output strobe signal QSOUT is used to appoint the take-in timing of the output data DQOUT. A positive-phase input strobe signal QSIN which is output from the control chip together with input data DQIN is transmitted to each of the FCRAMs through the positive-phase strobe line 32. The positive-phase input strobe signal QSIN is used to appoint the take-in timing of the input data DQIN. An inverse-phase output strobe signal /QSOUT has a phase which is in inverse relation to the phase of the positive-phase output strobe signal QSOUT. The inverse-phase output strobe signal /QSOUT output from each of the FCRAMs (e.g, the FCRAM 26) is transmitted to the control chip through the inverse-phase strobe line 33. An inverse-phase input strobe signal /QSIN has a phase which is in inverse relation to the phase of the positive-phase input strobe signal QSIN. The inverse-phase input strobe signal /QSIN output from the control chip is transmitted to each of the FCRAMs through the inverse-phase strobe line 33.

Figure 6:
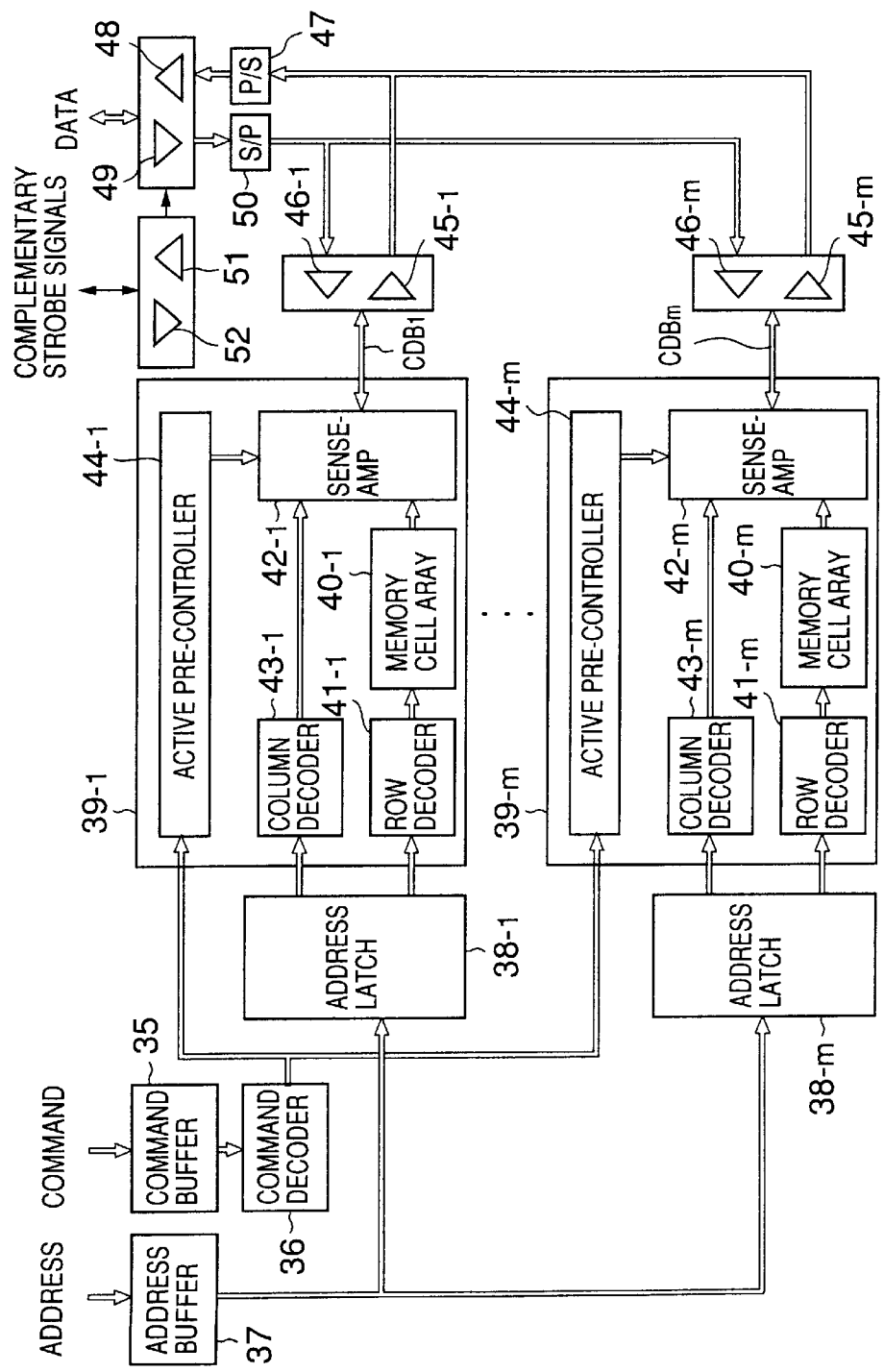
FIG. 6 is a circuit diagram illustrating an essential part of an FCRAM provided in the electronic instrument shown in FIG. 5.

An essential part of each of the FCRAMs (e.g., the FCRAM 26) is formed as shown in FIG. 6. Referring to FIG. 6, the FCRAM 26 has a command buffer 35, a command decoder 36, an address buffer 37, a plurality of memory banks 39-1–39-m and address latches 38-1–38-m. The command buffer 35 receives a command signal transmitted through the command bus 29. The command decoder 36 decodes the command signal output from the command buffer 35. The address buffer 37 receives a row address signal and a column address signal both of which are transmitted through the address bus 30. Each of the address latches 38-1–38-m is coupled to one of the memory banks 39-1–39-m. Each of the address latches 38-1–38-m latches the row address signal and the column address signal.

The memory bank 39-1 has a memory cell array 40-1, a row decoder 41-1, a sense-amp unit 42-1, a column decoder 43-11 and an active pre-controller 44-1. Plurality of memory cells are arranged in the memory cell array 40-1. The row decoder 41-1 decodes the row address signal latched by the address latch 38-1 to select a word line. In the sense-amp unit 42-1, sense amplifiers amplify data read out from a memory cell which is selected by the selected word line are arranged. The column decoder 43-1 decodes the column address signal latched by the address latch 38-1 to select a column. The active pre-controller 44-1 receives a decoded command signal from the command decoder 36 so as to control the column decoder 43-1 and the sense-amp unit 42-1 in accordance with the contents of the command.

The other memory banks (39-m) have the same structure as the memory bank 39-1.

A burst length specifying a number corresponding to a plurality of data items (bits) can be set in the FCDRAM 26. In such a case, a plurality of data items are read out from a selected memory bank in parallel in the data read operation, and a plurality of data items are written in a selected memory bank in parallel.

The FCRAM 26 has data bus buffers 45-1–45-m and write buffers 46-1–46-m. Each of the data bus buffers 45-1–45-m is coupled to a corresponding one of the memory banks 39-1–39-m and amplifies read data output from the corresponding one of the memory banks 39-1–39-m to a corresponding one of core data buses CDB1–CDBm. Each of the write buffers 46-1–46-m is coupled to a corresponding one of the memory banks 39-1–39-m and outputs write data to a corresponding one of the core data buses CDB1–CDBm.

The FCRAM 26 further has a parallel-to-serial converter 47, a data output buffer 48, a data input buffer 49, a serial-to-parallel converter 50, a strobe output buffer 51 and a strobe input buffer 52. The parallel-to-serial converter 47 converts parallel data transmitted from one of the data bus buffers 45-1–45-m which one corresponds to a selected memory bank into serial data. The data output buffer 48 outputs to the outside the serial data DQOUT1–DQOUTN, formed of N bits, supplied from the parallel-to-serial converter 47. The data input buffer 49 receives input data DQIN1–DQINN, formed of N bits, supplied from the outside. The serial-to parallel converter 50 converts the input data DQIN1–DQINN from the data input buffer 49 into parallel data. The strobe output buffer 51 outputs the positive-phase output strobe signal QSOUT to the positive-phase strobe signal line 32 and outputs the inverse-phase output strobe signal /QSOUT to the inverse-phase strobe signal line 33. The strobe input buffer 52 receives the positive-phase input strobe signal QSIN transmitted through the positive-phase strobe signal line 32 and receives the inverse-phase input strobe signal /QSIN transmitted through the inverse-phase strobe signal line 33.

Figure 7:
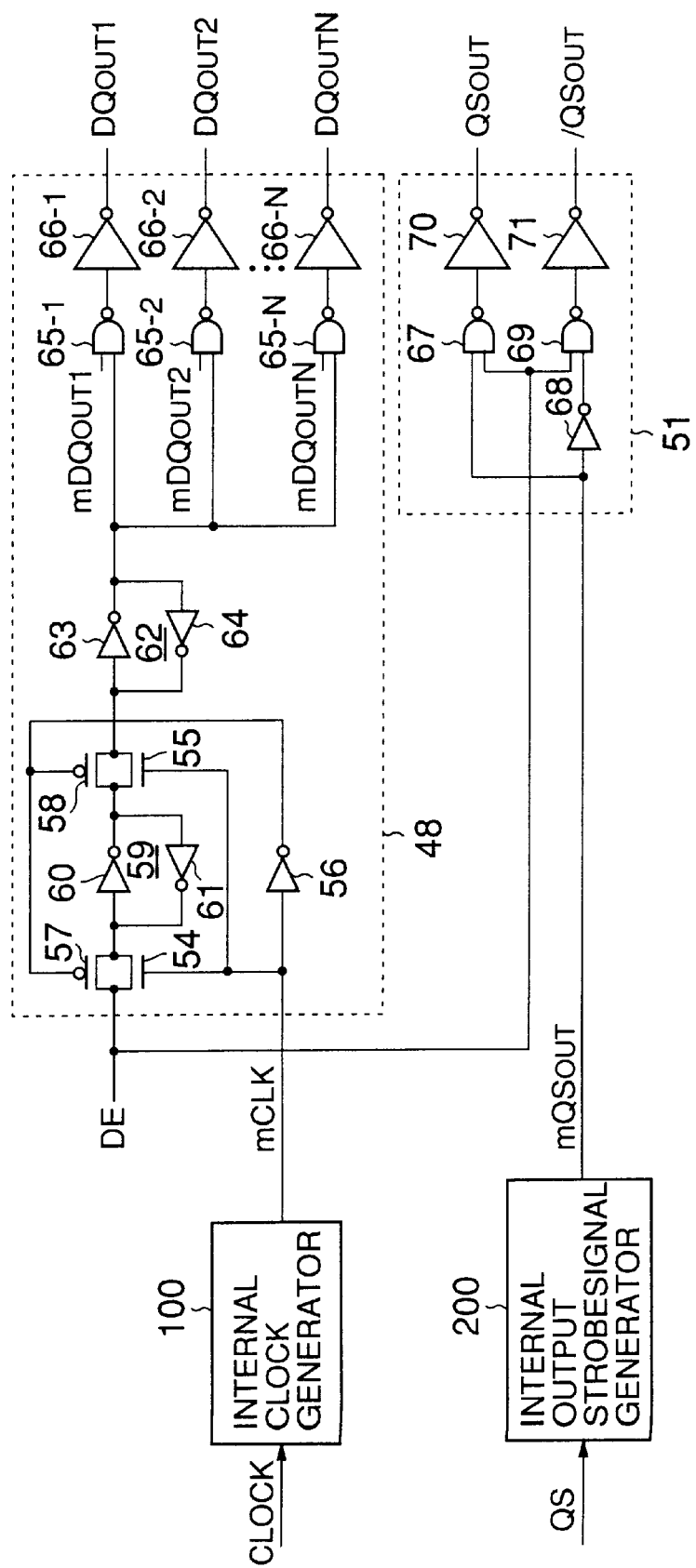
FIG. 7 is a circuit diagram illustrating a data output buffer and a strobe output buffer both of which are provided in the FCRAM shown in FIG. 6.

The data output buffer 48 and the strobe output buffer 51 are formed as shown in FIG. 7. Referring to FIG. 7, an internal clock generator 100 generates an internal clock signal mCLK based on a clock signal supplied to the FCRAM 26. An internal output strobe signal generator 200 generates an internal output strobe signal mQSOUT based on a strobe signal supplied to the FCRAM 26. The internal clock signal mCLK generated by the internal clock generator 100 and a data enable signal DE are supplied to the data output buffer 48.

The data output buffer 48 has a nMOS transistors 54 and 55, an inverter 56, pMOS transistors 57 and 58, a latch circuit 59 and a latch circuit 62. The nMOS transistors 54 and 55 are on-and-off controlled by the internal clock signal mCLK. The inverter 56 inverts the internal clock signal mCLK. The pMOS transistors 57 and 58 are on-and-off controlled by an inverted internal clock signal from the inverter 56. The latch circuit 59 is formed of inverters 60 and 61 and latches the data enable signal DE. The latch circuit 62 is formed of inverters 63 and 64 and latches the output from the latch circuit 59. The output signal from the latch circuit 62 is input to one of two ports of each of NAND gates 65-1–65-N. Each of internal data items mDQOUT1–mDQOUTN is input to another one of the two ports of a corresponding one of the NAND gates 65-1–65-N. An output port of each of the NAND gates 65-1–65-N is connected to a corresponding one of three-state inverters 66-1–66-N. When the data enable signal DE is valid (has a high level) and the internal clock mCLK has a high level, the signal latched by the latch circuit 59 has a low level and the signal latched by the latch circuit 62 has a high level. In this sate, the internal output data items mDQOUT1–mDQOUTN pass through the NAND gates 65-1–65-N and are output as the output data items DQOUT1–DQOUTN from the three-state inverters 66-1–66-N.

The strobe output buffer 51 has NAND gates 67 and 69, an inverter 68 and three-state inverters 70 and 71. The data enable signal DE is input to one of two input ports of each of the NAND gates 67 and 69. The internal output strobe signal mQSOUT is input to another one of the input ports of the NAND gate 67. The internal output strobe signal mQSOUT is inverted by the inverter 68 and the output signal from the inverter 68 is input to another one of the input ports of the NAND gate 69. The output signal from each of the NAND gates 67 and 69 is input to a corresponding one of the three-state inverters 70 and 71. When the data enable signal DE is valid (has a high level), the internal output strobe signal mQSOUT passes through the NAND gate 67 and is output as the positive-phase output strobe signal QSOUT from the three-state inverter 70. In addition, when the data enable signal DE is valid, the output signal from the inverter 68 passes through the NAND gate 69 and is output as the inverse-phase output strobe signal /QSOUT from the three-state inverter 71. Thus, the positive-phase output strobe signal QSOUT and the inverse-phase output strobe signal /QSOUT are in inverse relation to each other.

Figure 8:
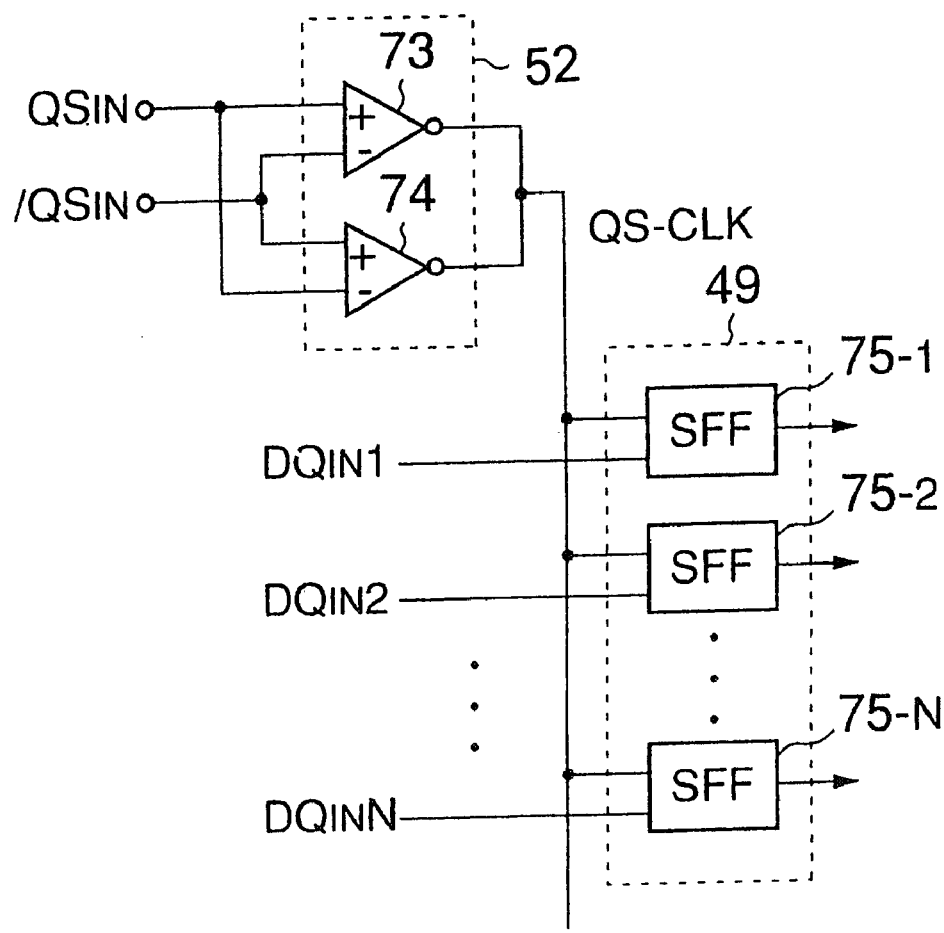
FIG. 8 is a circuit diagram illustrating a data input buffer and a strobe input buffer both of which are provided in the FCRAM shown in FIG. 6.

The data input buffer 49 and the strobe input buffer 52 are formed as shown in FIG. 8. Referring to FIG. 8, the strobe input buffer 52 has differential amplifiers 73 and 74. The positive-phase input strobe signal QSIN is input to a non-inverting terminal (+) of the differential amplifier 73 and an inverting terminal (−) of the differential amplifier 74. The inverse-phase input strobe signal /QSIN is input to an inverted terminal (−) of the differential amplifier 73 and a non-inverting terminal (+) of the differential amplifier 74. A strobe clock signal QS-CLK is obtained at a node at which output terminals of the differential amplifiers 73 and 74 are connected.

The data input buffer 49 has a plurality of synchronous flip flops (SFFs) 75-1–75-N. Each of the synchronous flip flops 75-1–75-N latches a corresponding one of the input data items DQIN1–DQINN in synchronism with the strobe clock signal QS-CLK supplied from the strobe input buffer 52.

Figure 9:
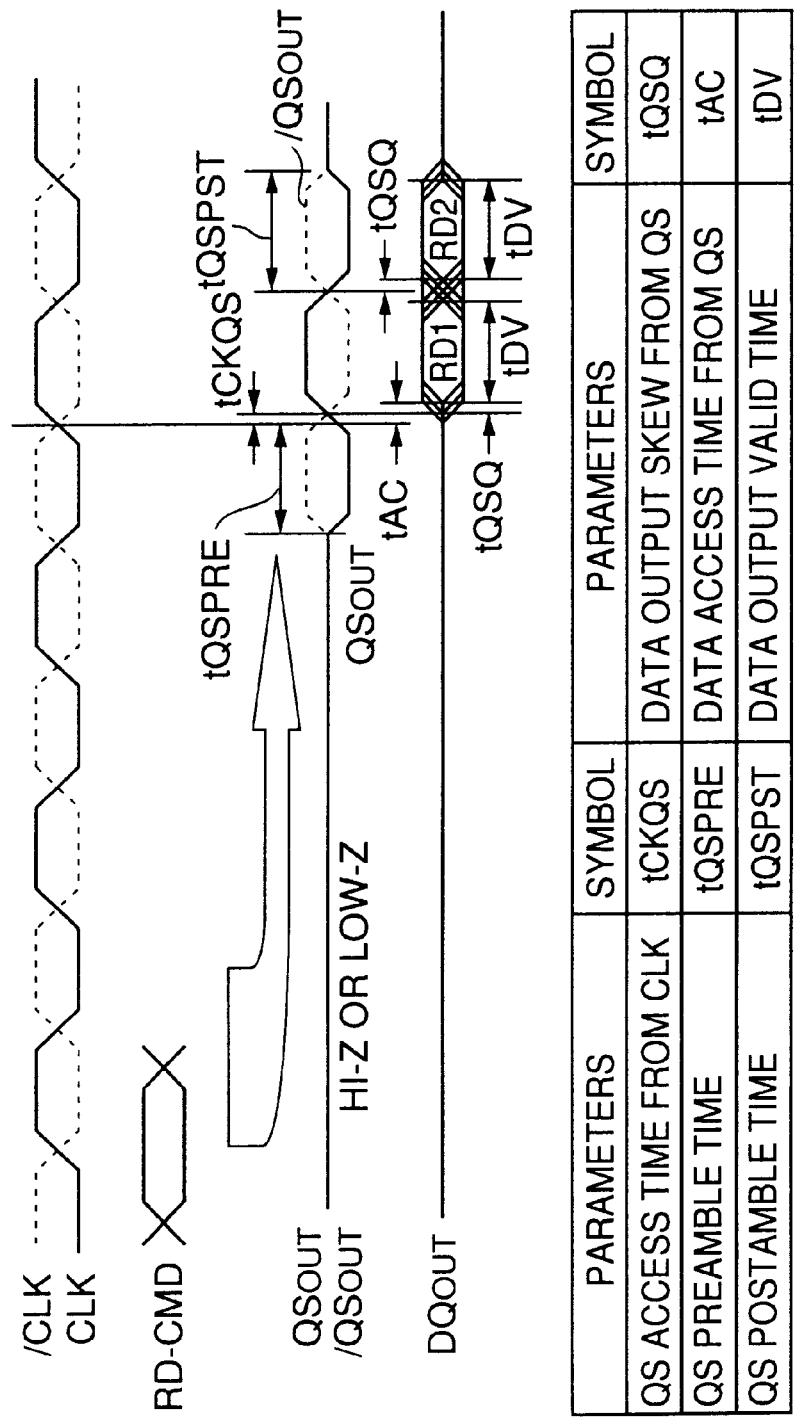
FIG. 9 is a timing chart illustrating signals and output data in a data output operation.

FIG. 9 shows a relationship among the complementary clock signals CLK and /CLK, the complementary output strobe signals QSOUT and /QSOUT, and output data items RD1 and RD2, which are consecutive two bits (DQOUT= RD1 and RD2), in the data output operation for the FCRAM 26. In the present embodiment shown in FIG. 9, a constant time period before the head of a cross point train of the complementary output strobe signals QSOUT and /QSOUT is set as the preamble time tQSPRE. The head of the cross point train corresponds to a start of a strobe period of the complementary output strobe signals QSOUT and /QSOUT. In the preamble time tQSPRE, the positive-phase output strobe signal QSOUT is controlled to be in a low level and the inverse-phase output strobe signal /QSOUT is controlled to be in a high level. These levels are set by use of the read command RD-CMD as a trigger.

In a case where a circuit has differential amplifiers which receive the positive-phase output strobe signal QSOUT and the inverse-phase output strobe signal /QSOUT, an internal level of the circuit is controlled by respectively setting the positive-phase output strobe signal QSOUT and the inverse-phase output strobe signal /QSOUT at the above levels in the preamble time tQSPRE. As a result, the circuit is controlled to be in a state where the output data DQOUT can receive.

In addition, a constant time period after a cross point of the complementary output strobe signals QSOUT and /QSOUT which cross point is the end of a period of the complementary output strobe signals QSOUT and /QSOUT is set as the postamble time tQSPST. In this time period, the levels of the positive-phase output strobe signal QSOUT and the inverse-phase output strobe signal /QSOUT differ from each other.

In a period of waiting time other than the preamble time tQSPRE, the output strobe valid time, a period of input strobe signal and the postamble time tQSPST, transistors of the FCRAM 26 which transistors drive the positive-phase strobe signal line 32 and the inverse-strobe signal line 33 are controlled to be in an off state. As a result, the positive-phase strobe signal line 32 and the inverse-phase strobe signal line 33 are in a floating state, such as a high impedance state (Hi-Z) or a low impedance state (Low-Z).

In addition, in the embodiment of the present invention, each cross point of the complementary output strobe signals QSOUT and /QSOUT is set at an edge trigger point of the output data DQOUT.

Figure 10:
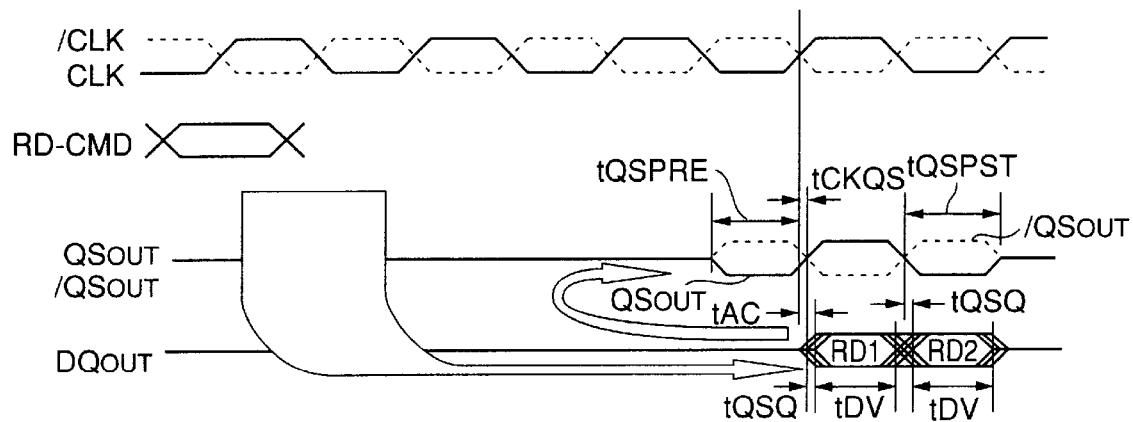
FIG. 10 is a timing chart illustrating an example of setting the level of complementary output strobe signals in a preamble time period in the data output operation for the FCRAM shown in FIG. 6.

In a case where there is a data latency with respect to the read command RD-CMD, the levels of the complementary output strobe signals QSOUT and /QSOUT in the preamble time tQSPRE may be set a predetermined time period before (e.g., one or half clock before) a first data item DQOUT= DR1 is output, as shown in FIG. 10.

Figure 11:
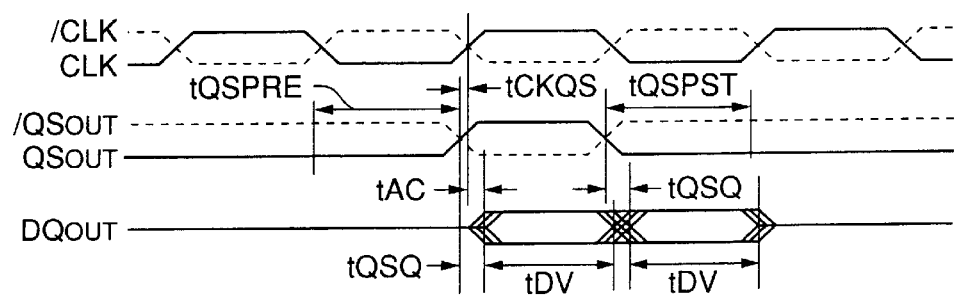
FIG. 11 is a timing chart illustrating an example of setting the level of the complementary output strobe signals in a waiting time period of the FCRAM shown in FIG. 6.

In a case where a complementary output strobe signal line and a complementary input strobe signal line are separated from each other and an even number of consecutive output data items DQOUT are output, the levels of the complementary output strobe signals QSOUT and /QSOUT may be controlled in the period of waiting time as shown in FIG. 11. That is, the positive-phase output strobe signal QSOUT and the inverse-phase output strobe signal /QSOUT may be respectively maintained at the low level and the high level in the same manner as in the postamble time tQSPST. In this case, there is no problem to cause the control chip to be in the state where the control chip can receive the output data.

Figure 12:
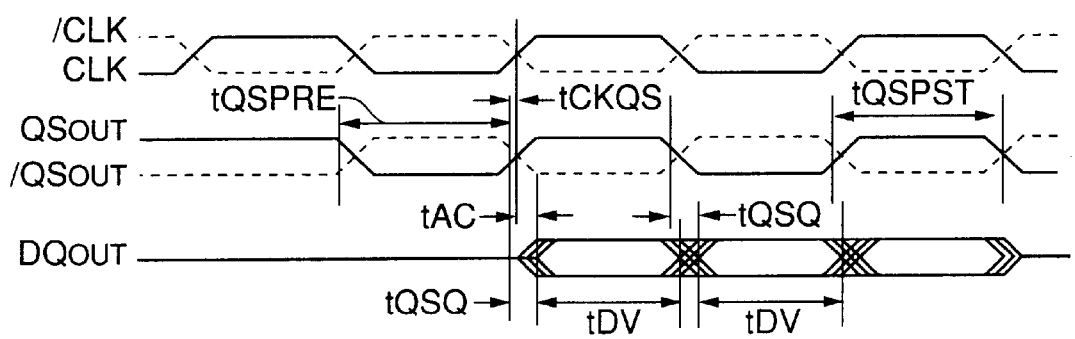
FIG. 12 is a timing chart illustrating another example of setting the level of the complementary output strobe signals in the waiting time period of the FCRAM shown in FIG. 6.

In addition, in a case where the complementary output strobe signal line and the complementary input strobe signal line are separated from each other and one or an odd number of consecutive data items DQOUT are output, the levels of the complementary output strove signals QSOUT and /QSOUT may be controlled in the period of waiting time as shown in FIG. 12. That is, the positive-phase output strobe signal QSOUT and the inverse-phase output strobe signal /QSOUT may be respectively maintained at the high level and the low level in the same manner as in the postamble time tQSPST and restored at the start of the preamble time tQSPRE in the next data read operation. In this case, there is no problem to cause the control chip to be in the state where the control chip can receive the output data.

Figure 13:
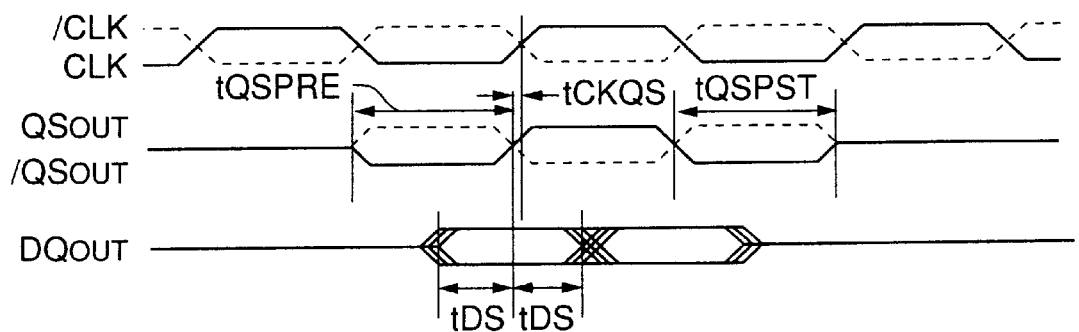
FIG. 13 is a timing chart illustrating a relationship between a cross point of the complementary output strobe signals and a center point of a valid time period of the output data.

In addition, each cross point of the complementary output strobe signals QSOUT and /QSOUT may be set at a center point of a period of the output data DQOUT as shown in FIG. 13.

Figure 14:
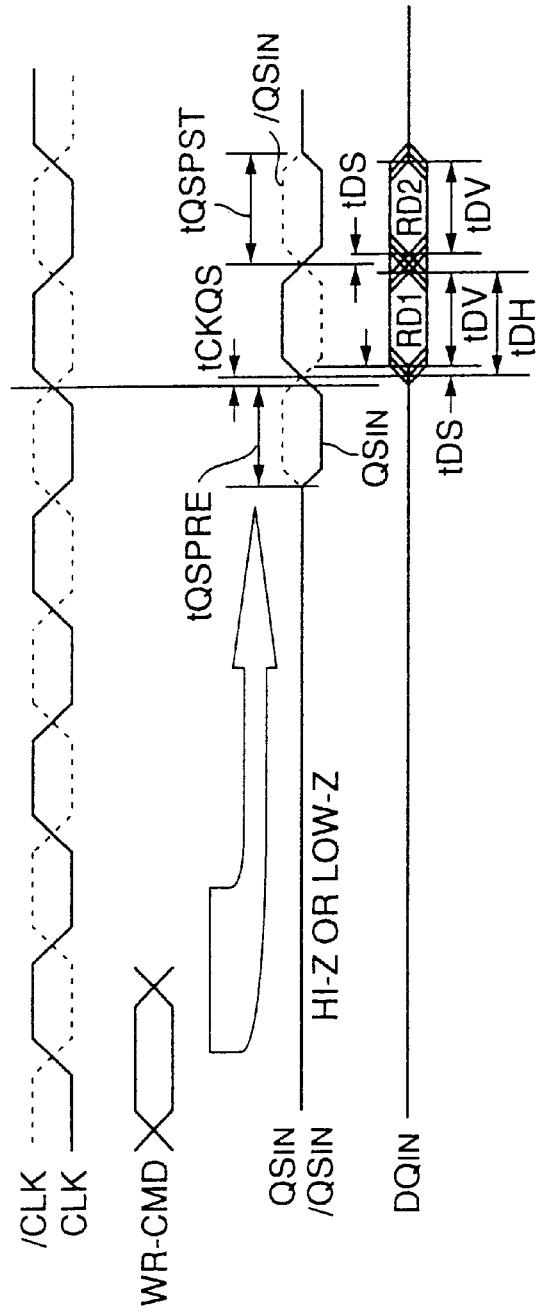
FIG. 14 is a timing chart illustrating signals and input data in the data input operation.

FIG. 14 shows a relationship among the complementary clock signals CLK and /CLK, the complementary input strobe signals QSIN and /QSIN and input data items W1 and W2, which are consecutive two bits (DQIN=W1 and W2), in the data input operation for the FCRAM 26. In the present embodiment shown in FIG. 14, a constant time before the head of a cross point train of the complementary input strobe signals QSIN and /QSIN is set as the preamble time tQSPRE. In the preamble time tQSPRE, the positive-phase input strobe signal QSIN is controlled to be in a low level and the inverse-phase input strobe signal /QSIN is controlled to be in a high level. These levels are set by use of the write command WR-CMD as a trigger.

In a case where a circuit has differential amplifiers which receive the positive-phase input strobe signal QSIN and the inverse-phase input strobe signal /QSIN, an internal level of the circuit is controlled by respectively setting the positive-phase input strobe signal QSIN and the inverse-phase input strobe signal /QSIN at the above levels in the preamble time tQSPRE. As a result, the circuit is controlled to be in a state where the input data DQIN can receive.

In addition, a constant time period after a cross point of the complementary input strobe signals QSIN and /QSIN which cross point is the end of a period of the complementary input strobe signals QSIN and /QSIN is set as the postamble time tQSPOT. In this time period, the levels of the positive-phase output strobe signal QSIN and the inverse-phase input strobe signal /QSIN differ from each other.

In a period of waiting time, transistors of the control chip which transistors drive the positive-phase strobe signal 32 and the inverse-phase strobe signal line 33 are controlled to be in an off state. As a result, the positive-phase strobe signal line 32 and the inverse-phase strobe signal line 33 are in a floating state, such as a high impedance state (Hi-Z) or a low impedance state (LOW-Z).

In addition, in the embodiment of the present invention, each cross point of the complementary input strobe signals QSIN and /QSIN is set at an edge trigger point of the input data DQIN.

Figure 15:
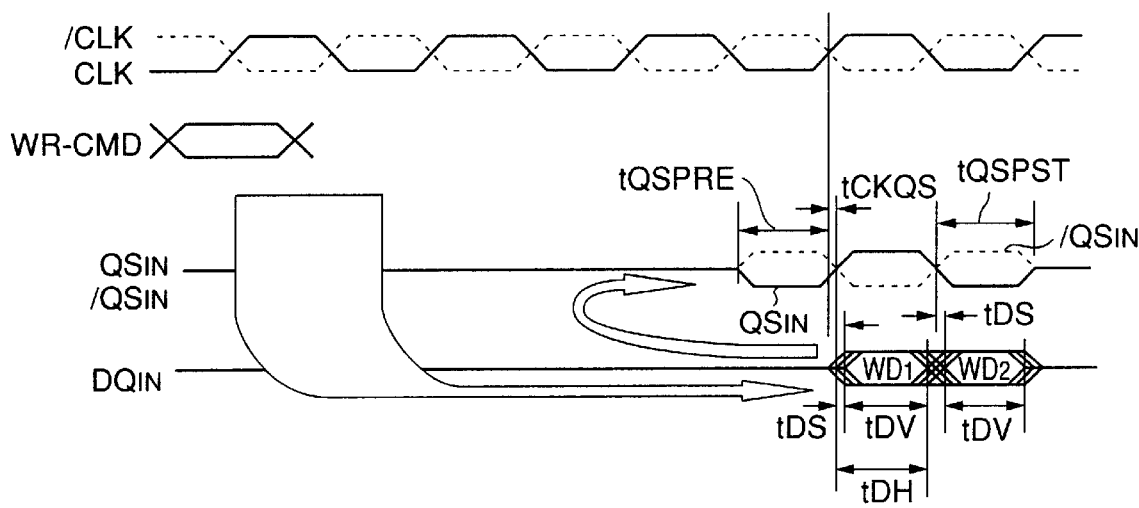
FIG. 15 is a timing chart illustrating an example of setting the level of complementary input strobe signals in the preamble time period in the data input operation.

In a case where there is a data latency with respect to the write command WR-CMD, the levels of the complementary input strobe signals QSIN and /QSIN in the preamble time tQSPRE may be set a predetermined time period before a first data item DIN=WD1 is output, as shown in FIG. 15.

Figure 16:
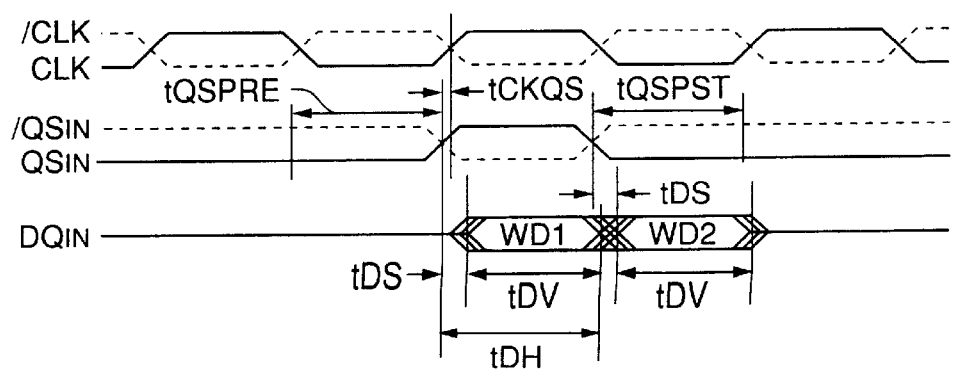
FIG. 16 is a timing chart illustrating an example of setting the level of the complementary input strobe signals in a waiting time period of a control chip.

In a case where a complementary output strobe signal line and a complementary input strobe signal line are separated from each other and an even number of consecutive input data items DQIN are input, the levels of the complementary input strobe signals QSIN and /QSIN may be controlled in the period of waiting time as shown in FIG. 16. That is, the positive-phase input strobe signal QSIN and the inverse-phase input strobe signal /QSIN may be respectively maintained at the low level and the high level in the same manner as in the postamble time tQSPST. In this case, there is not problem to cause the FCRAM to be in the state where the FCRAM can receive the input data.

Figure 17:
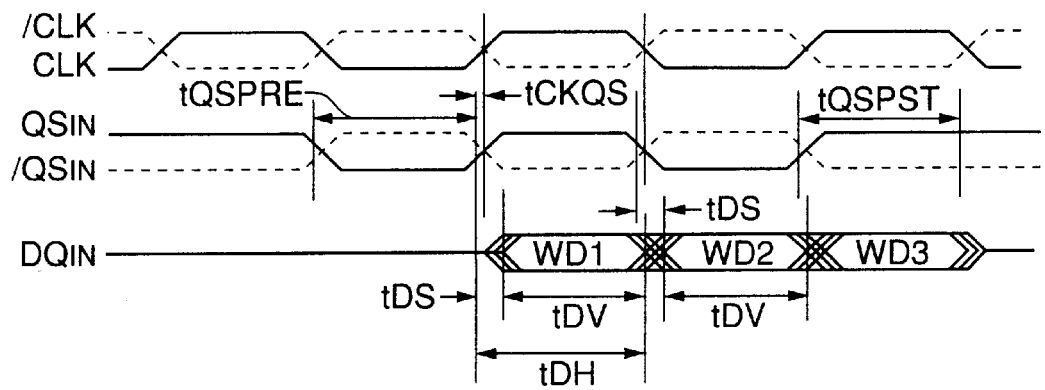
FIG. 17 is a timing chart illustrating another example of setting the level of the complementary strobe signals in the waiting time period of the control chip.

In addition, in a case where the complementary output strobe signal line and the complementary input strobe signal line are separated from each other and one or an odd number of consecutive data items DQIN are input, the levels of the complementary input strobe signals QSIN and /QSIN may be controlled in the period of waiting time as shown in FIG. 17. That is, the positive-phase input strobe signal QSIN and the inverse-phase input strobe signal /QSIN may be respectively maintained at the high level and the low level in the same manner as in the postamble time tQSPST and restored at the start of the preamble time tQSPRE in the next data write operation. In this case, there is no problem to cause the FCRAM to be in the state where the FCRAM can receive the input data.

Figure 18:
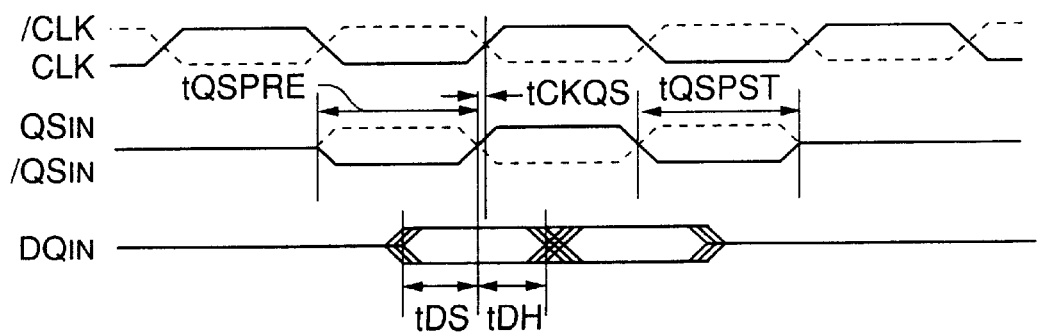
FIG. 18 is a timing chart illustrating a relationship between a cross point of the complementary input strobe signals and a center point of a valid time of the input data.

In addition, each cross point of the complementary input strobe signals QSIN and /QSIN may be set at a center point of a period of the input data DQIN as shown in FIG. 18.

As has been described above, in the electronic instrument according to the embodiment of the present invention, a set of the complementary output strobe signals QSOUT and /QSOUT is used as the output strobe signal. Thus, even if the rising time and falling time of the complementary output strobe signals QSOUT and /QSOUT are varied, the period of the complementary output strobe signals QSOUT and /QSOUT (a period between cross points of the complementary output strobe signals) can be constant. As a result, the period in which the output data DQOUT is settled can be constant.

In addition, a set of the complementary input strobe signals QSIN and /QSIN is used as the strobe signal. Thus, even if the rising time and falling time of the complementary input strobe signals QSIN and /QSIN are varied, the period of the complementary input strobe signals QSIN and /QSIN (the period between cross points of the complementary input strobe signals) can be constant. As a result, the period in which the input data DQIN is settled can be constant.

According to the electronic instrument of the embodiment of the present invention, even if the strobe period is shortened, for example, if the strobe period is equal to or less than 4 nanoseconds (ns), the data DQOUT and DQIN can be certainly transmitted and received.

In addition, in the FCRAM 26, data having a bit length corresponding to a burst length is read out, as parallel data, from the selected bank. The data is converted into serial data by the parallel-to-serial converter 47. The serial data is then supplied to the data output buffer 48. As a result, the data read operation can be performed at a high speed. Since the period of the complementary output strobe signals QSOUT and /QSOUT is constant so that the period in which the output data DQOUT is settled is constant, the parallel-to-serial converter 47 can have a margin for the operation.

In addition, in the FCRAM 26, the serial-to-parallel converter 50 is provided next to the data input buffer 49 and input data items DQIN (bits) corresponding to the burst length are successively supplied from the data input buffer 49 to the serial-to-parallel converter 50. The input data items DQIN are converted into parallel data by the serial-to-parallel converter 50 and the parallel data is written in the selected memory bank. As a result, the data write operation can be performed at a high speed. Since the period of the complementary input strobe signals QSIN and /QSIN is constant so that the period in which the input data DQIN is settled is constant, the serial-to-parallel converter 50 can have a margin for the operation.

The present invention is not limited to the aforementioned embodiments, and other variations and modifications may be made without departing from the scope of the claimed invention.

What is claimed is:

1. An electronic instrument comprising:

a memory device; and strobe signal lines through which a first output strobe signal and a second output strobe signal are transmitted in synchronism with output data from said memory device in a data output operation, the first and second output strobe signals being in complementary relation to each other, each of cross points of the first and second output strobe signals being set at an edge trigger point or a center point of a corresponding data item of the output data.

2. The electronic instrument as claimed in claim 1, wherein said memory device has a strobe output buffer that generates the first and second output strobe signals based on a predetermined signal, the first and second output strobe signals being supplied from said strobe output buffer to said strobe signal lines when the output data is output from said memory device.

3. The electronic instrument as claimed in claim 1, wherein the first and second output strobe signals have different levels in a preamble time which is a time period before a head of a cross point train of the first and second output strobe signals, the head of the cross point corresponding to a start of a strobe period of the first and second output strobe signals.

4. The electronic instrument as claimed in claim 3, wherein the first and second output strobe signals have different levels in a postamble time which is a time period after a cross point of the first and second output strobe signals which cross point corresponds to an end of a strobe period of the first and second output strobe signals.

5. The electronic instrument as claimed in claim 3, wherein the levels of the first and second output strobe signals in the preamble time are set by use of a read command as a trigger.

6. The electronic instrument as claimed in claim 3, wherein the levels of the first and second output strobe signals in the preamble time are set a predetermined time before a first output data item is output.

7. The electronic instrument as claimed in claim 6, wherein transistors of said memory device which transistors drive the strobe signal lines are controlled to be in a off state in a waiting time period.

8. An electronic instrument comprising:

a memory device; and strobe signal lines through which a first input strobe signal and a second input strobe signal are transmitted in synchronism with input data supplied to said memory device in a data input operation, the first and second input strobe signals being in complementary relation to each other, each of cross points of the first and second input strobe signals being set at an edge trigger point or a center point of a corresponding data item of the input data.

9. The electronic instrument as claimed in claim 8, wherein said memory device has a strobe input buffer that receives the first and second input strobe signals transmitted through said strobe signal lines and generates, based on the first and second input strobe signals, a strobe clock signal used to settle input data items supplied to said memory device.

10. The electronic instrument as claimed in claim 8, wherein the first and second input strobe signals have different levels in a preamble time which is a time period before a head of a cross point train of the first and second input strobe signals, the head of the cross point corresponding to a start of a strobe period of the first and second input strobe signals.

11. The electronic instrument as claimed in claim 10, wherein the first and second input strobe signals have different levels in a postamble time which is a time period after a cross point of the first and second input strobe signals which cross point corresponds to an end of a strobe period of the first and second input strobe signals.

12. The electronic instrument as claimed in claim 10, wherein the levels of the first and second input strobe signals in the preamble time are set by use of a write command as a trigger.

13. The electronic instrument as claimed in claim 10, wherein the levels of the first and second input strobe signals in the preamble time are set a predetermined time before a first input data item is received.

14. The electronic instrument as claimed in claim 13, wherein transistors of a unit supplying the input data to said memory device which transistors drive the strobe signal lines are controlled to be in a off state in a waiting time period.

15. An electronic instrument comprising:

a memory device; and strobe signal lines through which a first output strobe signal and a second output strobe signal are transmitted in synchronism with output data from said memory device in a data output operation and a first input strobe signal and a second input strobe signal are transmitted in synchronism with input data supplied to said memory device in a data input operation, the first and second output strobe signals being in complementary relation to each other, each of cross points of the first and second output strobe signals being set at an edge trigger point or a center point of a corresponding data item of the output data, the first and second input strobe signals being in complementary relation to each other, each of cross points of the first and second input strobe signals being set at an edge trigger point or a center point of a corresponding data item of the input data.

16. The electronic instrument as claimed in claim 15, said memory device comprises:

a strobe output buffer that generates the first and second output strobe signals based on a predetermined signal, the first and second output strobe signals being supplied from said strobe output buffer to said strobe signal lines when the output data is output from said memory device; and a strobe input buffer that receives the first and second input strobe signals transmitted through said strobe signal lines and generates, based on the first and second input strobe signals, a strobe clock signal used to settle input data items supplied to said memory device.

17. The electronic instrument as claimed in claim 15, wherein the first and second output strobe signals have different levels in a first preamble time which is a time period before a head of a cross point train of the first and second output strobe signals, the head of the cross point corresponding to a start of a strobe period of the first and second output strobe signals, and wherein the first and second input strobe signals have different levels in a second preamble time which is a time period before a head of a cross point train of the first and second input strobe signals, the head of the cross point corresponding to a start of a strobe period of the first and second input strobe signals.

18. The electronic instrument as claimed in claim 17, wherein the first and second output strobe signals have different levels in a first postamble time which is a time period after a cross point of the first and second output strobe signals which cross point corresponds to an end of a strobe period of the first and second output strobe signals, and wherein the first and second input strobe signals have different levels in a second postamble time which is a time period after a cross point of the first and second input strobe signals which cross point corresponds to an end of a strobe period of the first and second input strobe signals.

19. The electronic instrument as claimed in claim 18, wherein said strobe signal lines includes output strobe signal lines through which the first and second output strobe signals and input strobe signal lines through which the first and second input strobe signal lines, said output strobe signal lines and said input strobe signal lines being separated from each other, wherein when an even number of consecutive output data items are output, the levels of the first and second output strobe signals are controlled in a waiting time period to be maintained at the same levels as in the first postamble time, and wherein when an even number of consecutive input data items are supplied, the levels of the first and second input strobe signals are controlled in a waiting time period to be maintained at the same levels as in the second postamble time.

20. The electronic instrument as claimed in claim 18, wherein said strobe signal lines includes output strobe signal lines through which the first and second output strobe signals and input strobe signal lines through which the first and second input strobe signal lines, said output strobe signal lines and said input strobe signal lines being separated from each other, wherein when an odd number of consecutive data output items are output, the levels of the first and second output strove signals are controlled in a waiting time period to be maintained at the same levels as in the first postamble time and then restored at the start of the second preamble time in the next data read operation.

21. A semiconductor memory device comprising:
   a data output buffer that outputs output data to an exterior of said memory device; and
   a strobe output buffer that generates first and second output strobe signals, and outputs the first and second output strobe signals to the exterior of said memory device in synchronism with the outputting the of the output data, the first and second output strobe signals being in complementary relation to each other with each of cross points of the first and second output strobe signals being set at an edge trigger point or a center point of a corresponding data item of the output data.

22. A semiconductor memory device comprising:
   a strobe input buffer that receives first and second input strobe signals from an exterior of said memory device and generates a strobe clock signal based on the first and second input strobe signals, the first and second input strobe signals being in complementary relation to each other with each of cross points of the first and second input strobe signals being set at an edge trigger point or a center point of a corresponding data item of input data; and
   a data input buffer that latches the input data supplied from the exterior of said semiconductor memory device at such latch timings as defined by the strobe clock signal.

23. A semiconductor memory device comprising:
   a data output buffer that outputs output data to an exterior of said memory device;
   a strobe output buffer that generates first and second output strobe signals, and outputs the first and second output strobe signals to the exterior of said memory device in synchronism with the outputting of the output data, the first and second input strobe signals being in complementary relation to each other with each of cross points of the first and second output strobe signals being set at an edge trigger point or a center point of a corresponding data item of the output data;
   a strobe input buffer that receives first and second input strobe signals from an exterior of said memory device and generates a strobe clock signal based on the first and second input strobe signals, the first and second input strobe signals being in complementary relation to each other with each of cross points of the first and second input strobe signals being set at an edge trigger point or a center point of a corresponding data item of input data; and
   a data input buffer that latches the input data supplied from the exterior of said semiconductor memory device at such latch timings as defined by the strobe clock signal.

* * * * *

UNITED STATES PATENT AND TRADEMARK OFFICE
CERTIFICATE OF CORRECTION

PATENT NO. : 6,172,938 B1  Page 1 of 1
APPLICATION NO. : 09/338597
DATED : January 9, 2001
INVENTOR(S) : Takaaki Suzuki et al.

It is certified that error appears in the above-identified patent and that said Letters Patent is hereby corrected as shown below:

IN THE CLAIMS

Column 14, line 29, delete "input" and substitute therefor -- output --.

Signed and Sealed this

Twenty-third Day of September, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,172,938 B1 | Page 1 of 1 |
| APPLICATION NO. | : 09/338597 | |
| DATED | : January 9, 2001 | |
| INVENTOR(S) | : Takaaki Suzuki et al. | |

It is certified that error appears in the above-identified patent and that said Letters Patent is hereby corrected as shown below:

IN THE CLAIMS

Column 14, line 29, delete "input" and substitute therefor -- output --.

Signed and Sealed this

Seventh Day of October, 2008

JON W. DUDAS
*Director of the United States Patent and Trademark Office*

UNITED STATES PATENT AND TRADEMARK OFFICE
CERTIFICATE OF CORRECTION

PATENT NO. : 6,172,938 B1  
APPLICATION NO. : 09/338597  
DATED : January 9, 2001  
INVENTOR(S) : Takaaki Suzuki et al.

Page 1 of 1

It is certified that error appears in the above-identified patent and that said Letters Patent is hereby corrected as shown below:

This certificate vacates the Certificate of Correction issued October 7, 2008. The certificate is a duplicate of the Certificate of Correction issued September 23, 2008. All requested changes were included in the Certificate of Correction issued September 23, 2008.

Signed and Sealed this

Twenty-fifth Day of November, 2008

JON W. DUDAS  
*Director of the United States Patent and Trademark Office*